(12) United States Patent
Khaselev et al.

(10) Patent No.: US 7,678,255 B2
(45) Date of Patent: Mar. 16, 2010

(54) MASK AND METHOD FOR ELECTROKINETIC DEPOSITION AND PATTERNING PROCESS ON SUBSTRATES

(75) Inventors: Oscar Khaselev, Monmounth Junction, NJ (US); Brian G. Lewis, Branford, CT (US); Michael Marczi, Jersey City, NJ (US); Bawa Singh, Voorhees, NJ (US)

(73) Assignee: Fry's Metals, Inc., Jersey City, NJ (US)

( * ) Notice: Subject to any disclaimer, the term of this patent is extended or adjusted under 35 U.S.C. 154(b) by 972 days.

(21) Appl. No.: 11/419,128

(22) Filed: May 18, 2006

(65) Prior Publication Data

US 2006/0260943 A1 Nov. 23, 2006

Related U.S. Application Data

(60) Provisional application No. 60/682,130, filed on May 18, 2005.

(51) Int. Cl.
*C25D 13/12* (2006.01)
*G03G 13/32* (2006.01)

(52) U.S. Cl. .................................. 204/490; 427/458
(58) Field of Classification Search .......... 204/490; 427/458
See application file for complete search history.

(56) References Cited

U.S. PATENT DOCUMENTS

| | | | |
|---|---|---|---|
| 3,431,887 A | 3/1969 | Pettigrew et al. |
| 5,817,374 A | 10/1998 | Detig et al. |
| 5,981,043 A | 11/1999 | Murakami et al. |
| 6,027,630 A | 2/2000 | Cohen |
| 6,153,348 A | 11/2000 | Kydd et al. |
| 6,337,028 B1 | 1/2002 | Masuko et al. |
| 6,524,758 B2 | 2/2003 | Eberlein et al. |
| 6,579,652 B1 | 6/2003 | Detig et al. |
| 6,696,105 B2 * | 2/2004 | Hiroki et al. ............... 427/466 |
| 6,780,249 B2 | 8/2004 | Nelson et al. |
| 6,781,612 B1 | 8/2004 | Detig |
| 6,790,483 B2 | 9/2004 | Jagannathan et al. |
| 2002/0034617 A1 | 3/2002 | Eberlein et al. |
| 2003/0170553 A1 | 9/2003 | Eberlein et al. |
| 2003/0210318 A1 | 11/2003 | Detig |
| 2005/0100735 A1 | 5/2005 | Arora et al. |
| 2005/0106329 A1 | 5/2005 | Lewis et al. |

FOREIGN PATENT DOCUMENTS

| | | |
|---|---|---|
| WO | 02/48980 A1 | 6/2002 |
| WO | 02/063397 A1 | 8/2002 |
| WO | 02/071465 A1 | 9/2002 |
| WO | 2005/033352 A2 | 4/2005 |

OTHER PUBLICATIONS

Written Opinion, PCT/US2006/019250, dated Sep. 27, 2007, 5 pages.
International Search Report, PCT/US2006/019250, dated Sep. 27, 2007, 3 pages.

* cited by examiner

*Primary Examiner*—Kishor Mayekar
(74) *Attorney, Agent, or Firm*—Senniger Powers LLP

(57) ABSTRACT

A mask for application to a substrate to facilitate electrokinetic deposition of charged particles onto the substrate, the mask comprising a conducting layer, a dielectric layer, and mask openings. A method for applying a pattern of charged particles to a substrate comprising applying the foregoing the substrate to yield a masked substrate; immersing the masked substrate in a bath containing the charged particles; and establishing an electrical potential between the conducting layer of the mask and a counter-electrode thereby electrokinetically depositing the particles through the mask openings onto areas of the substrate exposed in the mask openings. Products made by this method.

16 Claims, 4 Drawing Sheets

US 7,678,255 B2

MASK AND METHOD FOR ELECTROKINETIC DEPOSITION AND PATTERNING PROCESS ON SUBSTRATES

CROSS REFERENCE TO RELATED APPLICATION

This application claims priority from provisional U.S. application 60/682,130, filed May 18, 2005, the entire disclosure of which is explicitly incorporated by reference.

FIELD OF THE INVENTION

This invention relates to a mask and method for producing patterned articles by deposition of powder, particles, spheres, or other materials onto a substrate. Applications for this technology include but are not limited to display technology (conducting and insulating traces on glass, plastics, patterning phosphorous, etc), printed electronics (solderable surfaces/solderability protectant layers, conductors, dielectrics, passive components etc), medical (patterning assay chemicals, drug dosage measures, etc), parallel assembly processes (RFID die, electronic components, etc.), and others.

BACKGROUND OF THE INVENTION

In a variety of applications it is desirable to apply particles to a substrate in a predetermined pattern. One such application is the formation of patterns of solder alloys on silicon wafers, printed circuit boards, flip chip, and BGA submounts.

International patent application publication WO 2005/033352 (PCT/US2004/022143) (U.S. Pub. no. 2005/0106329) discloses a process of electrokinetic deposition of metal particles such as tin or tin alloy powder as an effective method to form solderable surfaces and structures on electronic parts and components.

In the electrokinetic deposition process the substrate to be coated having masked surfaces and unmasked surfaces is immersed in a bath with electrokinetic toner. A typical bath (toner) for electrokinetic deposition of tin powder consists of solvent (e.g., Isopar), charge director (e.g., barium petronate), and metal particles. To assure the process of electrokinetic deposition a second (counter) electrode is also immersed in the bath and electrical voltage is applied between two electrodes. Under the influence of an applied electrical field the charged powder particles are deposited on the unmasked surfaces of the coated substrate. One requirement for the process to occur is that the surfaces to be coated should be electrically conductive and also electrically connected to the voltage power supply. This requirement limits the application of electrokinetic deposition to substrates having at least one complete conductive layer.

SUMMARY OF THE INVENTION

Briefly, therefore, in one aspect the invention is directed to a method for applying a pattern of charged particles to a substrate comprising applying a mask having a conducting layer, a dielectric layer, and mask openings to the substrate to yield a masked substrate having unmasked surfaces defined by the mask openings; immersing the masked substrate in a bath containing the charged particles; and establishing an electrical potential between the conducting layer of the mask and a counter-electrode thereby electrokinetically attracting the charged particles to exposed surfaces on the conducting layer in the mask openings to deposit the charged particles in the mask openings.

In another aspect the invention is directed to the foregoing method wherein the substrate is non-conductive.

The invention is also directed to a product comprising features formed by a method for applying a pattern of charged particles to a substrate comprising applying a mask having a conducting layer, a dielectric layer, and mask openings to the substrate to yield a masked substrate having unmasked surfaces defined by the mask openings; immersing the masked substrate in a bath containing the charged particles; and establishing an electrical potential between the conducting layer of the mask and a counter-electrode thereby electrokinetically attracting the charged particles to exposed surfaces on the conducting layer in the mask openings to deposit the charged particles in the mask openings.

The invention is also directed to this product wherein the features are metal features formed from metal particles deposited by this method.

The invention is also directed to a mask for application to a substrate to facilitate electrokinetic deposition of charged particles onto the substrate, the mask comprising an electrically conducting layer, a dielectric layer adhered to the conducting layer, and mask openings which define a pattern for deposition of the charged particles onto the substrate.

Other objects and features of the invention will be in part apparent and in part pointed out hereinbelow.

DETAILED DESCRIPTION OF PREFERRED EMBODIMENTS

Figure 1:
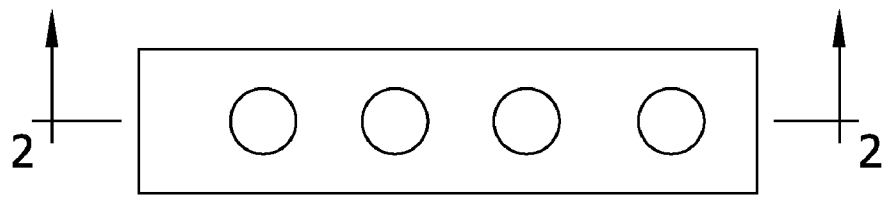
FIG. 1 is a schematic top view of a mask of the invention.

The product of the invention is a mask for use in a method involving electrokinetic deposition and patterning on non-conductive substrates, as well as on substrates having non-conductive surfaces and isolated conducting surfaces (e.g., less than 20% conductive surfaces). In sharp contrast to the electrokinetic method of U.S. Pub. no. 2005/0106329, these substrates include glass, polymers, ceramics, semiconductors, and laminates which have all or at least largely nonconductive surfaces.

This mask and method are applicable to deposition of particles in a wide variety of manufacturing operations where it is desirable to deposit particles in a pattern on a substrate, and particularly on a non-conducting substrate. These applications include but are not limited to display technology (conducting and insulating traces on glass, plastics, patterning phosphorus, etc), printed electronics (solderable surfaces/solderable protectant layers, conductors, dielectrics, passive components etc), medical (patterning assay chemicals, drug dosage measures, etc), parallel assembly processes (RFID die, electronic components, etc.), and others.

In one aspect of the invention, the deposition is performed in a manner similar to the electrokinetic deposition in U.S. patent application Ser. No. 10/888,286 (Publication no. 2005/0106329), the entire disclosure of which is expressly incorporated herein by reference. However, the invention is a departure from the prior method in that the invention establishes electrical potential between a mask layer and a counter-electrode, rather than between the substrate and a counter-electrode. Thus, the invention is a further departure in that it involves a point of attraction for the particles which is on the mask, rather than on the substrate itself. Also, the mask is applicable to other deposition methods involving a submerged electrode associated with the substrate surface and a counter-electrode.

The foregoing methods of the invention are suitable for depositing metal particles of a broad range of sizes. In one approach the particles are powder, typically with an average particle size between about 2 and about 100 microns. In another approach they are mid-sized particles, such as having an average particle size between about 50 and about 500 microns. In another approach they are relatively large spheres, such as having an average diameter of at least about 100 microns, such as between about 100 microns and about 1 mm, or between about 300 microns and about 1 mm. An advantage of spheres is that they are 100% dense, in contrast to on the order of 50% dense for powder. Also, spheres can be deposited at a finer pitch than can volumes of powder because a sphere is better defined than an equal volume of powder, and because a smaller sphere can be used to yield the same amount of solder, after reflow, as a larger volume of powder. Spheres also facilitate the above-described single mask technique where the mask holes are much shallower than the deposit height.

The preparation of particles for deposition involves imparting a charge thereto which renders them electrokinetically mobile. Provided this criterion is satisfied, the preparation method is not critical to the invention. The particles can be prepared as described in the art, and in accordance with the following illustrative, non-limiting, and non-exhaustive alternative methods. For example, for a Sn-alloy solder powder coating, Joncryl 682 resin available from Johnson Polymer, LLC of Studevant, Wis. (USA) may be dissolved in methanol to a concentration of 20% then spray coated onto Type 6 Sn63Pb37 solder powder obtained from Welco GmbH, Potsdam, Germany. The spraying is achieved by a Wurster Process performed by Coating Place, Inc. of Verona, Wis. (USA). Then, by way of example, for toner preparation, coated powder (120 g) is added to 1 liter of Isopar G in a 1.4 liter beaker and stirred with an appropriate mixer, such as "The Agitator" available from Victory Engineering, Hillside, N.J. (USA). Magnetic stir bars are not used because they abrade the coating off the powder. Charge director (21 drops; –0.016 ml per drop) is added to the mixture and the stirring continued for at least four hours. The toner is allowed to age for two days at room temperature. The toner is protected from a high humidity environment (>60% RH) to maintain stable performance.

For preparation of the aforementioned charge director, for example, barium petronate (10 g) available from Crompton Corporation of Middlebury, Conn. (USA) is added to Isopar G (90 g) available from ExxonMobil Chemical Company of Houston, Tex. (USA) in a 200 ml beaker. The beaker is placed on a heated stir plate and heated/stirred until it reaches a temperature of 80-90 C. Highly polished water (10 g), i.e., very pure distilled water is added one drop (about 16 microliter) at a time while the solution is continually stirred and heated. After all the water is added the solution is stirred and heated for a further one hour. The heat is then removed and stirring is continued until the solution has cooled. A tan-colored precipitate is noted to form. The mixture is aged for one day at room temperature, then filtered and the precipitate discarded.

To prepare the particles in other embodiments, they are coated with a material selected from among ionic surfactant materials, non-ionic materials such as non-ionic polymers, organic acids and/or bases, and mixtures thereof. Depending on how the coating is physically carried out, the coating medium may also contain a solvent. That is, if coating is accomplished by immersion in a solution, spraying with a solution, or exposure to a solution in a fluidized bed, a solvent is needed. On the other hand, if the coating is accomplished by a plasma coating process or the like, no solvent is required. Among the surfactant materials which are suitable for coating particles according to this invention are those disclosed in U.S. Patent Publication 2005/0100735.

The foregoing coating materials render the coated particles amenable to treatment with a charge director, so that the particles can be treated with a charge director to render them electrokinetically mobile. This coating provides a surface characterized as, for example, a very hydroxyl surface or a very acidic surface with which a subsequently applied charge director can react. In selecting a coating material, if the particles are metal particles to be used as a solder, it is preferable to select one which provides a fluxing function in the eventual powder when it is used as a solder.

The particles in this variation comprise the particle bodies; the above-described coating medium on the particle bodies which facilitates attachment thereto of a charge director material, wherein the coating medium is selected from the group consisting of anionic species, non-ionic species, cationic species, acids, bases, and mixtures thereof; and the above-described charge director material on the coating medium wherein the charge director material has a positive or negative charge and thereby renders the particle bodies electrokinetically mobile.

To use the particles in the process of the invention, as noted, the particles are introduced into a solution containing an electrolyte or polyelectrolyte, also known as a charge director. Examples of suitable electrolytes and polyelectrolytes include, but are not limited to, those disclosed in the aforementioned publications. This thereby yields electrokinetically mobile particles for use in the deposition process.

Thereafter, the particles are dried by pan drying, spray drying, or other suitable means. The function of the electrolyte or polyelectrolyte is to facilitate maintenance of electrical charge so the particles will respond in desired electrokinetic manner.

In preparation for deposition, the particles are combined and wetted with a liquid having suitable dielectric properties. One example of such a liquid is the Isopar product. Another example is a product available from 3-M Corporation under the trade name Fluorinert. The combined particles and liquid ranges from about 2% by weight particles up to about 90% by weight particles. The particles constitute from about 2 to about 60% of the mixture on a volume basis.

Figure 2:
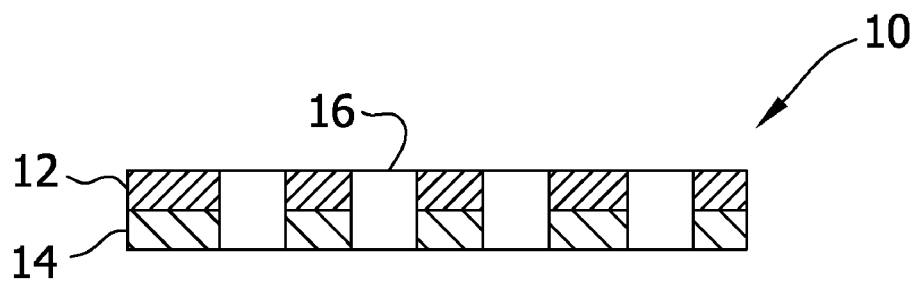
FIG. 2 is a side cross-section taken along line 2-2.
Figure 6:
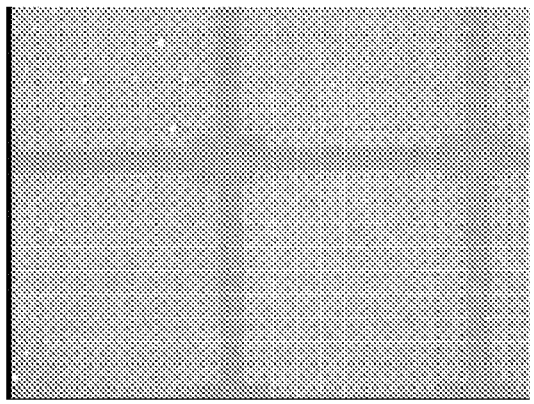
FIGS. 6 and 7 are photographs of a mask of the invention applied to a substrate.
Figure 7:
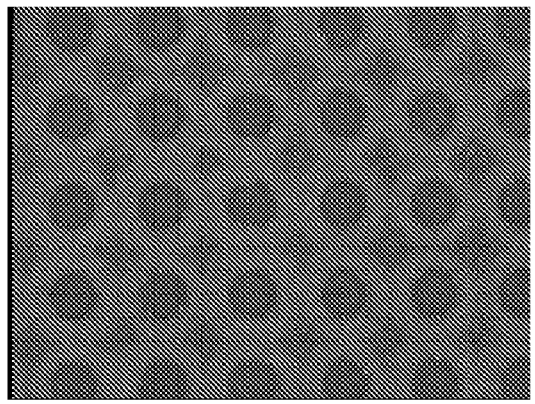

In accordance with the present invention, a mask is employed which provides a) an electrical connection necessary for electrokinetic deposition, and b) patterning to form various structures from deposited materials. The mask 10 in FIGS. 1 and 2 has a first layer 12 which is a dielectric material, and a second layer 14 which is an electrical conductor. Among preferable materials for the first layer is a dry photo resist film, such as an epoxy laminate. Among preferable materials for the second layer, i.e., the conductive layer 14, are stainless steel, nickel, aluminum, molybdenum, and chromium. The mask has openings 16 which provide patterning on the substrate. The mask is shown here with only one row of openings for simplicity; but typically has many such rows as shown in FIGS. 6 and 7.

The mask may be prepared by coating the dielectric material 12 onto the conductive material 12 by lamination, gluing, spin-coating, dip-coating, or via a stencil similar to screen printing. The openings 16 may be on the conductive material prior to application of the dielectric, or the holes can be drilled after coating with the dielectric.

In one embodiment, the conductive layer 14 is overcoated with a non-conductive coating 12 which defines a dielectric layer of the mask. The non-conductive coating 12 can be a dry photo resist film such as an epoxy laminate. This coating 12 can be, in one embodiment, contain a photoimageable agent. For example, it can be selected from among acrylic-based, polyimide-based, commercially available epoxy-based PWB solder mask coatings, and a variety of commercially available organic photoimageable photopolymer coatings. One suitable polymer is a thick-film spin-on photosensitive polymer available under the designation AZPDP100XT, or novalac-based AZPLP-100, both available from Clariant of Bridgewater, N.J. Another is polystyrene-based material available under the trade designation Futurrex. This coating (dielectric layer 12 of the mask) is, for example, at least about 1 micron, such as between about 1 micron and about 250 microns thick for solder bumping of silicon wafers. The conductive layer 14 is, for example, between about 50 microns and about 1 cm thick.

The mask 10 is subjected to a cure in, for example, a box oven, to cure the polymer forming the dielectric layer 12, if required according to supplier specifications.

Figure 3:
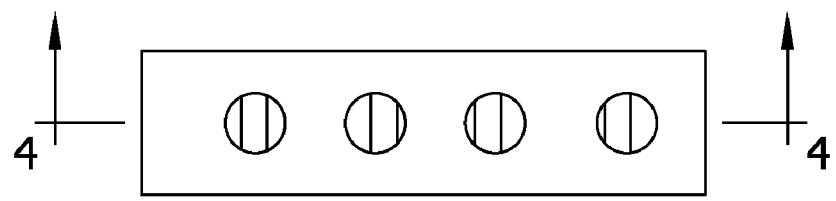
FIG. 3 is a schematic top view of a mask of the invention applied to a substrate.
Figure 4:
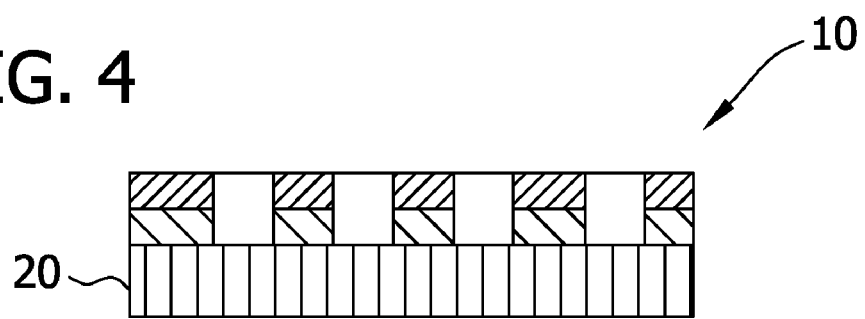
FIG. 4 is a side cross-section taken along line 3-3.

In carrying out the method, as shown in FIGS. 3 and 4 the mask 10 is positioned on the surface of the substrate 20 which is to receive deposited particles. The masked substrate is immersed into a bath 28 in vessel 34 comprising the particles 24 to be deposited, as shown schematically in FIG. 5. Voltage via power supply 30 is applied between the conducting layer 14 of the mask 10 and a counter-electrode 26 immersed in the bath.

Under the influence of the electrical field, charged particles 24 in the bath are attracted to the exposed areas of conducting layer 14 thus depositing on the substrate 20 and filling the openings 16 in the mask 10. After the deposition, particles can be fused to the substrate by melting, sintering, or curing (heat, UV, catalyst).

The particles which are deposited in accordance with the invention include particles of metals, metal alloys, polymers and other organics, ceramics, semiconductors, and inorganic compounds. For example, the particles deposited include, but are not limited to, those disclosed in that U.S. Patent Publication no. 2005/0106329 as well as in Ser. No. 10/888,619 (Publication no. 2005/0100735), the entire disclosure of which is expressly incorporated herein by reference. In accordance with this invention, organic or inorganic particles are coated in order to render them amenable to treatment with a charge director, so that the particles can thereby be rendered electrokinetically or electrostatically mobile. In one preferred embodiment, the particles are a selected from among the metals/alloys Sn, Sn/Pb, Sn/Ag/Cu, Sn/Ag, Cu, Sn/Ag/Bi, Sn/Bi, Sn/Pb/Bi or others. The characteristics of the particles, for example the foregoing Sn-based and other particles, which are deposited by this method include nanopowders, micron-sized round powders, macro particles up to 300 microns, and others.

Figure 5:
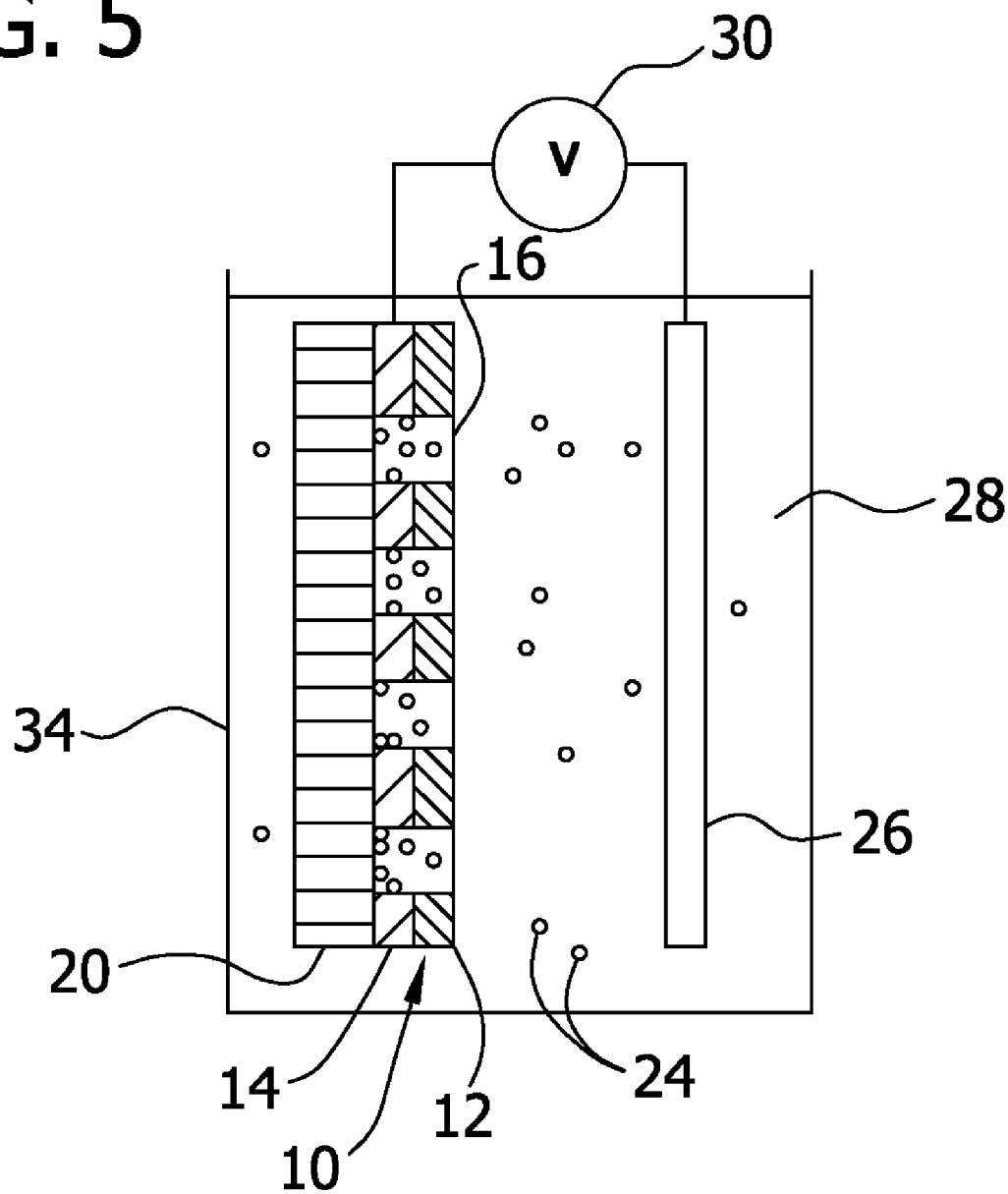
FIG. 5 is a schematic illustration of the use of the mask of the invention.

In carrying out the method of the invention, a substrate with the mask applied thereto is immersed in a suspension 28 of particles 24 to be deposited as shown in FIG. 5. The conductive surface 14 of the mask serves as an electrode, and there is an immersed counter-electrode 26 adjacent the substrate. A potential via 30 is applied between the two electrodes to drive the charged particles to the substrate. The suspension properties are engineered to provide the correct liquid phase conductivity and particle charge-to-mass ratio. Image contrast is obtained because the particles are attracted to the potential applied to the conductive layer 14 on the mask and are not attracted to the dielectric surface 12 of the mask. A charge on the mask builds up due to migration of charge carriers through the electrolyte to the mask material.

The deposition driving force is primarily attraction of the charged particles to the oppositely charge electrical pole of the potential applied to the conductive layer 14 of the mask. The conductive layer 14 is attached to an electrical connection to apply an electrical potential between it and the counter-electrode 26. The substrate is immersed in the particle slurry (electrokinetic solution) 28. The counter-electrode 26 immersed in the slurry completes an electrical circuit. A vertical orientation of the substrate to the top surface of the slurry as shown here in FIG. 5 is preferred in one embodiment.

An electrical potential with the conductive layer 14 of the mask 10 being the positive pole is applied between the mask and the counter-electrode 26 in the instance where the particles are treated to have a negative chemical charge. Alternatively, an electrical potential with the conductive layer 14 of the mask 10 being the negative pole is imparted to the conductive layer of the mask in the instance where the particles are treated to have a positive charge. For example, the negative terminal of the circuit is attached to a counter-electrode plate in the slurry and the positive terminal is attached to the conductive layer of the mask. Or a positive terminal of the circuit is attached to a counter-electrode plate in the slurry and the negative terminal is attached to the conductive layer of the mask.

The charged particles 24 in the slurry 28 are attracted to the conductive layer 14, which is established as a terminal of polarity opposite to the charge on the particles. The charged particles move through the electrical field generated by the electrical potential between the conductive layer of the mask and the counter-electrode. With the electrode and counter-electrode attached to opposite poles of the voltage supply establishing an electrical potential between them, the particles are electrokinetically deposited into the holes 16 on the unmasked portions of the substrate adjacent the conductive portion of the mask. In this embodiment there is no need to apply a corona charge to the dielectric layer 12 of the mask. The mask acts as a mechanical and electrostatic barrier. Electrostatic charge builds up on the dielectric layer 12 of the mask due to carrier flow through the electrolyte, which shapes an electrical field, which electrically propels charged particles into holes in the mask.

This method involves a single deposition step with an AC potential of, e.g., 50+/−50 V to 500+/−500 V. An alternative embodiment involves varying the electrical potential applied between the conductive layer of the mask and the counter-electrode to cause deposition. In one embodiment, this involves sweeping or ramping of a voltage slowly upward during all or less than all of the deposition. In another embodiment this involves increasing the potential in a more stepwise fashion. For example, it involves achieving a first period of the deposition at a potential between about 50+/−50 V and about 500+/−500 V; and a second and third period of the deposition at a potential between about 200+/−200 V and about 300+/−300 V. These three iterations correspond roughly to three phases of deposition involving a) filling of the bottom of the recesses; b) filling the recesses up to their tops, even with the top of the non-conducting layer; and c) overfilling on top of the already deposited particles. Other embodiments employ a variation in the number of iterations other than three, ranging from two to several. This stepwise deposition appears to provide more dense deposition and less voiding or pinching because the filling of the mask holes is more orderly.

With regard to other parameters of the deposition process, the potential is applied as a sine wave or, more preferably, as saw tooth wave. The frequency is between about 10 and 1000 Hz, preferably between about 50 and 500 Hz, more preferably between about 75 and 150 Hz. The time period for the deposition is in the range of about 2 to about 30 seconds, such as in the range of about 5 to about 20 seconds or, for one specific embodiment, in the range of about 8 to about 15 seconds. The distance between the substrate and the counter-electrode is between about 5 and about 6 mm in one embodiment. As a general proposition, this distance is between about 3 and about 10 mm, most typically between about 4 and about 7-mm.

Without being bound to a particular theory, it is believed that during the early deposition of metal particles on the deepest feature of the substrate, a relatively weaker electrical potential results in fewer particles being attracted to the conductive layer 14 than if the electrical potential is stronger, reducing the chance of crowding too many particles into the feature in a short period of time. If the electrical potential is stronger initially, particles may aggressively crowd into the feature and pinch off the recess openings to the substrate or result in excessive voiding. The initially weaker electrical potential moves the particles less aggressively such that they can tightly pack onto the substrate without numerous particles being forced to simultaneously enter recesses in the non-conducting layer.

After the appropriate dwell time, the substrate is removed vertically or at some angle such that it is not parallel to the top surface of the solution. In one preferred embodiment the substrate is at an angle of between about 15 and about 75 degrees from vertical during removal. Vibration of the substrate as described above in connection with the electrostatic mode has also been found to be advantageous in connection with the electrokinetic mode.

After deposition the substrate is optionally washed by brief immersion in a rinse solution, with the mask openings containing the deposited particles facing down. This can also be accomplished by in-situ washing in the same vessel as the deposition, which involves simultaneous removal of the slurry and replacement with particle-free rinse solution.

The substrate may then optionally be subjected to a corona charge to impart an electrostatic clamp on the deposited particles. In particular, a corona generator with a potential of, for example, 5 to 7 kilovolts is passed over the substrate to impart a corona charge. This helps hold the particles in place because of the electrostatic forces applied to the mask.

Figure 9:
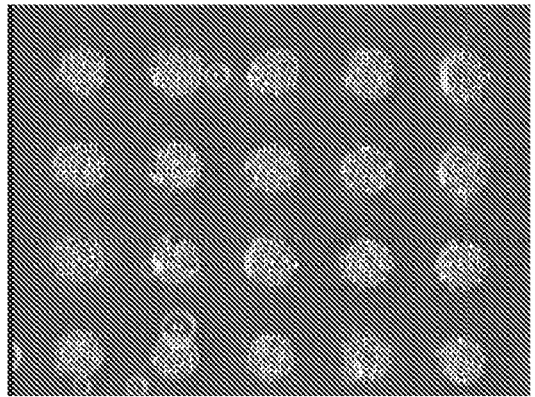

Residual solvent is dried off by exposing the substrate to an elevated temperature, typically in the range of 30 C to 60 C, depending on the nature of the solvent in the slurry. This yields a substrate of the type as illustrated in FIG. 9 with solder powder particles thereon.

As described, therefore, the invention involves applying a pattern of charged particles 24 to a substrate comprising applying a mask 10 having a conducting layer 14, a dielectric layer 12, and mask openings 16 to the substrate to yield a masked substrate having unmasked surfaces defined by the mask openings 16; immersing the masked substrate in the bath 28 containing the charged particles 24; and establishing an electrical potential 30 between the conducting layer 14 of the mask and a counter-electrode 26 thereby electrokinetically attracting the charged particles 24 to exposed surfaces on the conducting layer 14 in the mask openings 16 to deposit the charged particles in the mask openings 16.

The solder is then reflowed by placement in, for example, a standard multizone solder reflow oven or, preferably, a low oxygen (<100 ppm, more preferably<20 ppm) reflow oven. It is preferred that the substrate be heated from below. During reflow, the coating on the metal particles functions as a flux. Auxiliary fluxing such as with a sprayed-on liquid flux can also be used to aid reflow. The mask is removed, which yields the substrate with solder bumps thereon.

In a further variation using the mask of the invention in a different manner, a separate printing tool is used on which the mask of the invention defines the pattern in which the particles are to be transferred to the substrate. This printing tool is an insulating support having a flat surface, and the mask is applied thereto similar to what is shown in FIG. 4, except that a flat tool surface is used in place of substrate 20. An exemplary printing tool is constructed from a material such as polyimides and epoxies, has a thickness between about 1 and about 200 microns, and tool surface dimensions ranging from about 1 cm to about 100 cm in diameter.

The tool with mask 10 thereon is flooded with the particle and liquid mixture, and potential applied between the conducting layer of the mask and the counter-electrode, such that the particles are taken up on portions of the tool not shielded by the mask, i.e., in the holes 16. In this manner the tool surface is exposed to particles in a dielectric fluid, which particles have an electrochemical charge, to thereby cause a quantity of the particles to deposit on the unmasked areas on the tool surface and thereby yield a patterned tool surface with particles on the unmasked areas. Any loose particles are rinsed from the tool by an application of pure dielectric liquid vehicle. This method is particularly successful in working with metal spheres having an average diameter of at least about 100 microns, such as between about 100 microns and about 1 mm.

The silicon wafer or other substrate to which the particles will be transferred from the tool is prepared by prewetting with a dielectric liquid. The substrate is attached to a thoroughly grounded support.

Transfer to the substrate is accomplished by closely exposing the patterned tool surface with particles adhered thereto to a surface of an electronic device or other substrate to thereby transfer at least a portion of the quantity of particles from the patterned tool surface to the surface of the substrate in a substrate pattern defined by the pattern on the patterned tool surface. To accomplish this in one embodiment, the charged and rinsed tool is placed over the substrate surface to be patterned, with a gap of between about 20 microns and about 300 microns separating the substrate from the tool surface. Due a lower charge potential of the substrate as compared to the tool, the particles transfer to the substrate, retaining the same pattern they defined on the tool surface. Alternatively, the potential applied to the conductive layer of the mask can be changed at this point to promote transfer to the substrate. Or, if the substrate itself is conductive, a potential which promotes such transfer can be applied to it.

The dielectric liquid is then evaporated from the substrate. The solder is melted and fused to the substrate by conventional solder reflow technology involving, for example, baking the substrate in an oven to heat the substrate and solder to a reflow temperature.

EXAMPLE 1

Figure 8:
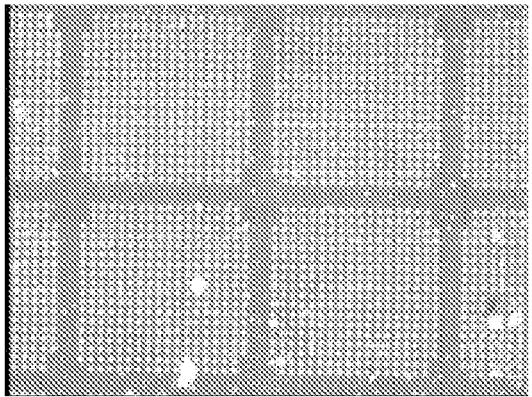
FIGS. 8 and 9 are photographs of the mask and substrate of FIGS. 6 and 7 with solder metal particles deposited into holes in the mask.

A non-conducting laminate is employed as a substrate. A mask is prepared which is a copper layer coated with solder mask, and having openings 125 μm diameter. FIGS. 6 and 7 illustrate the substrate with the mask applied thereto. The deposition is conducted in the toner similar to one described in WO 2005/033352, with a bath comprising Isopar, 120 g/l pretreated solder powder, and 0.5 ml of 10% barium petronate solution. The substrate with mask applied is immersed in the bath with a counter-electrode. A voltage of 200 V is applied between the copper layer and the counter-electrode. After 20 seconds, deposition openings in the mask are filled with solder powder. FIGS. 8 and 9 show the substrate after deposition of the solder powder particles.

EXAMPLE 2

Figure 10:
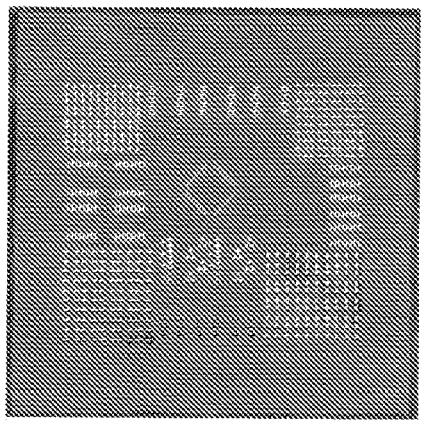
FIG. 10 is a photograph of a mask of the invention.
Figure 12:
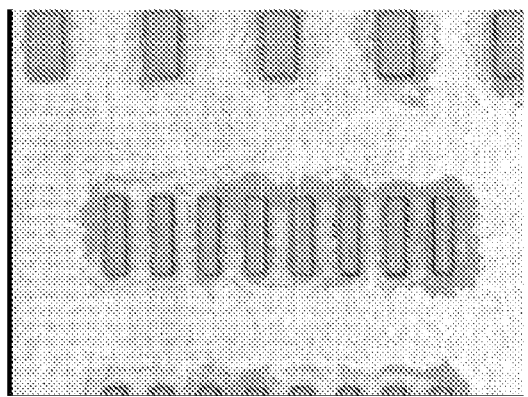
FIG. 12 is a photograph of solder powder deposition into openings of the mask of FIG. 11.
Figure 11:
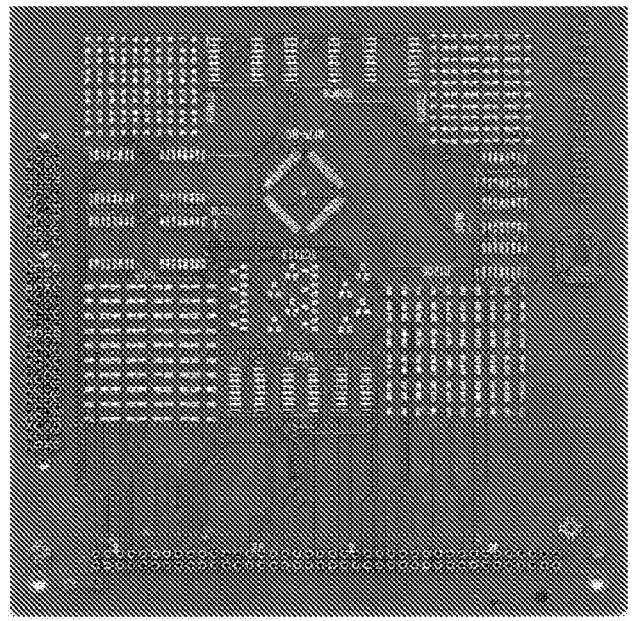
FIG. 11 is a photograph of a mask of the invention applied to a PWB substrate.

A mask consisting of a stainless steel conductive layer with epoxy laminate was prepared by the above procedure in the pattern shown in FIG. 10. The mask was placed over a PWB substrate as shown in FIG. 11. Solder powder was deposited in the openings of the mask by the above procedure to yield solder particles on the substrate as shown in FIG. 12. This illustrates the capability of the invention for depositing at tight pitch and wide line capability.

Although the methods and materials of the invention are described above chiefly in the context of applying metal particles to substrates, the methods and materials are applicable to deposition of non-metal particles as well, provided the nature of the particles is such that they can be imparted with an electrochemical charge. Examples of such processes involving non-metal powders include deposition of phosphors, glasses, ceramics, semiconductor materials such, e.g., for use in flat panel displays or the like.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The foregoing relates to a limited number of embodiments that have been provided for illustration purposes only. It is intended that the scope of invention is defined by the appended claims and there are modifications of the above embodiments that do not depart from the scope of the invention.

What is claimed is:

1. A method for applying a pattern of charged particles to a substrate comprising:
   applying a mask having a conducting layer, a dielectric layer, and mask openings to the substrate with the conducting layer of the mask between the substrate and the dielectric layer to yield a masked substrate having unmasked surfaces defined by the mask openings;
   immersing the masked substrate in a bath containing the charged particles; and
   establishing an electrical potential between the conducting layer of the mask and a counter-electrode thereby electrokinetically attracting the charged particles to exposed surfaces on the conducting layer in the mask openings to deposit the charged particles in the mask openings.

2. The method of claim 1 wherein the mask openings into which charged particles are deposited include mask openings which define unmasked surfaces which are non-conductive surfaces of the substrate.

3. The method of claim 1 wherein all surfaces of the substrate are non-conductive.

4. The method of claim 1 wherein the charged particles are powder particles having an average size between about 2 and about 100 microns.

5. The method of claim 1 wherein the charged particles have an average size between about 50 and about 500 microns.

6. The method of claim 1 wherein the charged particles have an average size between about 300 microns and about 1 mm.

7. The method of claim 1 wherein the charged particles are Sn-based particles.

8. The method of claim 1 wherein the charged particles are made from materials selected from among the metals and alloys Sn, Sn/Pb, Sn/Ag/Cu, Sn/Ag, Cu, Sn/Ag/Bi, Sn/Bi, and Sn/Pb/Bi.

9. The method of claim 1 wherein the conducting layer has a thickness between about 50 microns and about 1 cm and the dielectric layer has a thickness between about 1 and about 250 microns.

10. A method for applying a pattern of charged particles to a non-conductive substrate comprising:
    applying a mask having a conducting layer, a dielectric layer, and mask openings to the substrate to with the conducting layer of the mask between the substrate and the dielectric layer to yield a masked substrate having unmasked surfaces defined by the mask openings;
    immersing the masked substrate in a bath containing the charged particles; and
    establishing an electrical potential between the conducting layer of the mask and a counter-electrode thereby electrokinetically attracting the charged particles to exposed surfaces on the conducting layer in the mask openings to deposit the charged particles in the mask openings.

11. The method of claim 10 wherein the charged particles are powder particles having an average size between about 2 and about 100 microns.

12. The method of claim 10 wherein the charged particles have an average size between about 50 and about 500 microns.

13. The method of claim 10 wherein the charged particles have an average size between about 300 microns and about 1 mm.

14. The method of claim 10 wherein the charged particles are Sn-based particles.

15. The method of claim 10 wherein the charged particles are made from materials selected from among the metals and alloys Sn, Sn/Pb, Sn/Ag/Cu, Sn/Ag, Cu, Sn/Ag/Bi, Sn/Bi, and Sn/Pb/Bi.

16. A method for applying a pattern of charged particles to a substrate comprising:
    applying a mask to the substrate to yield a masked substrate comprising an electrically conducting layer, a dielectric layer adhered to the conducting layer, and mask openings which define a pattern for deposition of the charged particles onto the substrate;
    immersing the masked substrate in a bath containing the charged particles; and
    establishing an electrical potential between the conducting layer of the mask and a counter-electrode thereby electrokinetically depositing the particles through the mask openings onto areas of the substrate exposed in said mask openings.

* * * * *